(12) United States Patent
Moon et al.

(10) Patent No.: US 9,518,719 B2
(45) Date of Patent: Dec. 13, 2016

(54) LIGHT EMITTING DEVICE

(71) Applicant: LG ELECTRONICS INC., Seoul (KR)

(72) Inventors: Euna Moon, Seoul (KR); Hongkyu Lee, Seoul (KR); Yeonhong Jung, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 136 days.

(21) Appl. No.: 14/621,023

(22) Filed: Feb. 12, 2015

(65) Prior Publication Data
US 2016/0123556 A1 May 5, 2016

(30) Foreign Application Priority Data

Oct. 29, 2014 (KR) ........................ 10-2014-0148147

(51) Int. Cl.
| F21V 9/16 | (2006.01) |
| C09K 11/77 | (2006.01) |
| H01L 25/075 | (2006.01) |
| F21Y 113/00 | (2016.01) |
| H01L 33/50 | (2010.01) |

(52) U.S. Cl.
CPC ............ *F21V 9/16* (2013.01); *C09K 11/7721* (2013.01); *C09K 11/7734* (2013.01); *C09K 11/7774* (2013.01); *H01L 25/0753* (2013.01); *F21Y 2113/005* (2013.01); *H01L 33/504* (2013.01)

(58) Field of Classification Search
CPC ..... F21V 9/16; C09K 11/7721; C09K 11/7774
See application file for complete search history.

(56) References Cited

U.S. PATENT DOCUMENTS

| 7,911,127 B2 | 3/2011 | Sohn et al. |
| 9,087,968 B2 | 7/2015 | Lee et al. |
| 2005/0212404 A1 | 9/2005 | Chen et al. |
| 2006/0221635 A1 | 10/2006 | Sohn et al. |
| 2007/0274093 A1 | 11/2007 | Haim et al. |
| 2008/0149957 A1 | 6/2008 | Kameshima et al. |
| 2012/0274240 A1 | 11/2012 | Lee et al. |
| 2012/0326627 A1 | 12/2012 | McDaniel, Jr. |
| 2013/0020931 A1 | 1/2013 | Ko et al. |

FOREIGN PATENT DOCUMENTS

| KR | 10-0799839 B1 | 1/2008 |
| KR | 10-1164926 B1 | 7/2012 |
| KR | 10-2012-0122376 A | 11/2012 |
| KR | 10-2013-0010283 A | 1/2013 |

*Primary Examiner* — Elmito Breval
(74) *Attorney, Agent, or Firm* — Birch, Stewart, Kolasch & Birch, LLP

(57) ABSTRACT

A light emitting device is provided. The light emitting device includes a first white light source emitting a white light of which color coordinates exist within a MacAdam 10-step ellipse from color coordinates (0.4822, 0.3980); a second white light source emitting a white light of which color coordinates exist within a MacAdam 10-step ellipse from color coordinates (0.4180, 0.4337); and a third white light source emitting a white light of which color coordinates exist within a MacAdam 10-step ellipse from color coordinates (0.2806, 0.2981).

20 Claims, 9 Drawing Sheets

LIGHT EMITTING DEVICE

CROSS-REFERENCE TO RELATED APPLICATIONS

The present application claims priority of Korean Patent Application No. 10-2014-0148147 filed on Oct. 29, 2014, which is hereby incorporated by reference in its entirety.

BACKGROUND

The present disclosure relates to a light emitting device, and more particularly, to a light emitting device that may emit a white light having various color temperatures by using a few white light sources.

A light emitting diode LED is a highly efficient and environmentally-friendly light source and is taking center stage in various fields. For example, the LED is being used in many fields such as a display device, a car, and general lighting. In particular, a demand for a white-light emitting device implementing a white light is gradually increasing.

A phosphor in the LED functions as a medium that changes energy of an excitation source to energy of a visible light and the efficiency of the phosphor is an important element associated directly with the efficiency of a display product.

There is a light emitting device using a blue LED as one of light emitting devices emitting a white light. The light emitting device using the blue LED uses a blue light as an excitation source to apply a yellow phosphor emitting a yellow light to a LED emitting a blue light, so the blue light emitted from the blue LED is mixed with the yellow light emitted from the yellow phosphor to implement a white color.

That is, the light emitting device emitting the white light uses a method of applying a YAG:Ce phosphor showing a yellow color to the blue LED to obtain the white light, as a method of applying a phosphor to the blue LED to use a blue light emitted from the blue LED and a second light source emitted from the phosphor.

There are limitations in that the method involves quantum deficits resulting from using the second light and efficiency decrease resulting from re-emission efficiency and color rendering is not easy. Thus, since a typical white-light emitting device is implemented by combining the blue LED and the yellow phosphor, it lacks green and red components and thus it is difficult to express natural colors. Thus, the typical white-light emitting device is being limitatively applied to the screen of a portable phone or notebook computer. Nevertheless, it has been widely used because it is easy to operate and remarkably cheap.

A light emitting device needs to control or change the color temperature of emitted light but the typical light emitting device has a limitation in that it is difficult to control the color temperature of light emitted by using a few white light sources.

SUMMARY

Embodiments provide a new light emitting device.

Embodiments also provide a light emitting device that may emit light having various color temperatures by using a few white light sources.

In one embodiment, a light emitting device includes a first white light source emitting a white light of which color coordinates exist within a MacAdam 10-step ellipse from color coordinates (0.4822, 0.3980); a second white light source emitting a white light of which color coordinates exist within a MacAdam 10-step ellipse from color coordinates (0.4180, 0.4337); and a third white light source emitting a white light of which color coordinates exist within a MacAdam 10-step ellipse from color coordinates (0.2806, 0.2981).

In another embodiment, a light emitting device includes a first white light source including a blue LED and phosphors, wherein the phosphors include a third phosphor emitting light having a main wavelength of about 555 nm to about 575 nm, and a fourth phosphor emitting light having a main wavelength of about 580 nm to about 610 nm; a second white light source including the blue LED and phosphors, wherein the phosphors include a third phosphor emitting light having a main wavelength of about 555 nm to about 575 nm, and a fourth phosphor emitting light having a main wavelength of about 580 nm to about 610 nm; and a third white light source including the blue light emitting diode (LED) and phosphors, wherein the phosphors include a first phosphor emitting light having a main wavelength of about 495 nm to about 510 nm, a second phosphor emitting light having a main wavelength of about 550 nm to about 555 nm, a third phosphor emitting light having a main wavelength of about 555 nm to about 575 nm, and a fourth phosphor emitting light having a main wavelength of about 580 nm to about 610 nm.

The details of one or more embodiments are set forth in the accompanying drawings and the description below. Other features will be apparent from the description and drawings, and from the claims.

DETAILED DESCRIPTION OF THE EMBODIMENTS

A light emitting device according to an embodiment is described below in detail with reference to the accompanying drawings.

Figure 1:
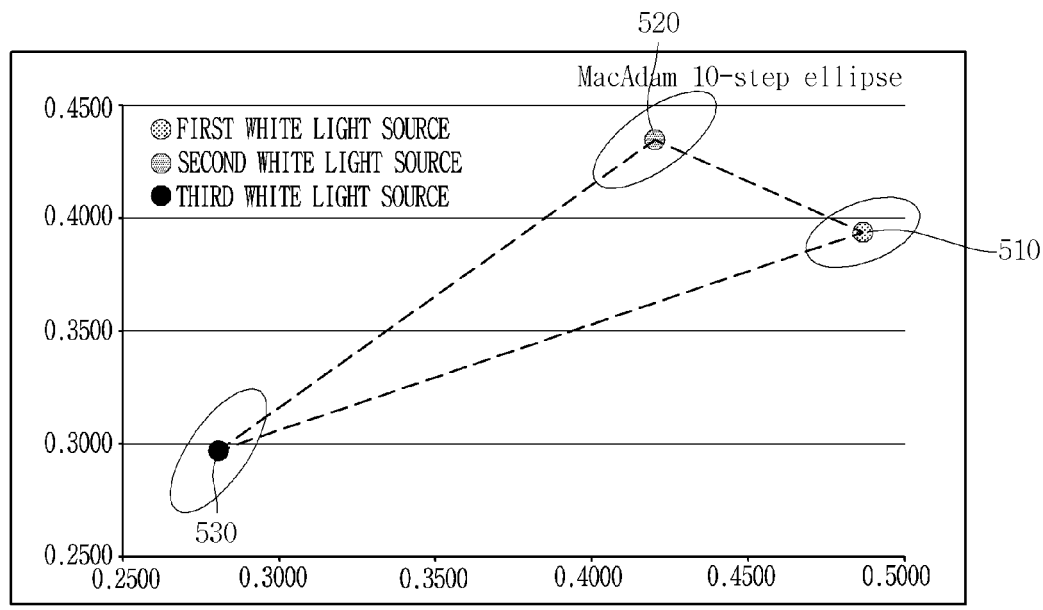
FIG. 1 depicts the color coordinates of light emitted from white light sources in a light emitting device according to an embodiment.

FIG. 1 depicts the color coordinates of light emitted from white light sources in a light emitting device according to an embodiment.

Referring to FIG. 1, the light emitting device according to an embodiment includes a first white light source 510 having first color coordinates, a second white light source 520 having second color coordinates different from the first color coordinates, and a third white light source 530 having third color coordinates different from the first and second color coordinates.

The central color coordinates of the first white light source 510 are (0.4822, 0.3980), and a white light emitted from the first white light source 10 exists within a MacAdam 10-step ellipse from the color coordinates (0.4822, 0.3980).

Also, the central color coordinates of the second white light source 520 are (0.4180, 0.4337), and a white light emitted from the second white light source 520 exists within a MacAdam 10-step ellipse from the color coordinates (0.4180, 0.4337).

Also, the central color coordinates of the third white light source 530 are (0.2806, 0.2981), and a white light emitted from the third white light source 530 exists within a MacAdam 10-step ellipse from the color coordinates (0.2806, 0.2981).

The light emitting device may implement whit lights having various color temperatures such as 3000K, 4000K and 5000K by controlling the light quantity of the first to third white light sources 510 to 530.

Respective white light sources such as first to third white light sources 510 to 530 in a light emitting device of an embodiment include a blue light emitting diode (LED) and two or three kinds of phosphors. The light emitting device of the embodiment may achieve high color rendering, high efficiency and low costs.

Respective white light sources in the light emitting device of the embodiment may use a blue LED as an excitation light source, and the blued LED may use a gallium nitride based LED chip, for example.

Figure 2:
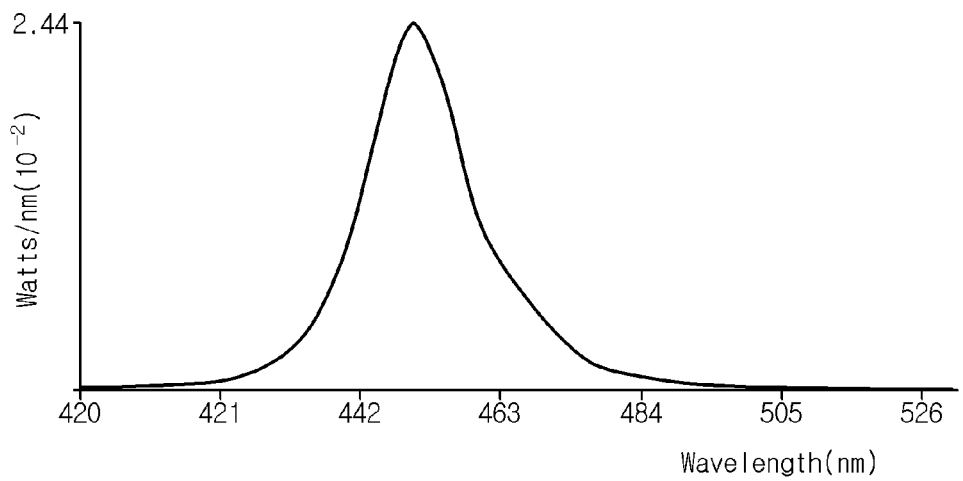
FIG. 2 shows the light emitting characteristic of a blue light emitting diode (LED) capable of being used in a light emitting device according to an embodiment.

FIG. 2 shows the light emitting characteristic of a blue LED capable of being used in a light emitting device according to an embodiment.

Referring to FIG. 2, an excitation light source in the whit light source of the embodiment may use a blue LED having a peak wavelength of about 440 nm to about 460 nm and a main wavelength of about 445 nm to about 460 nm or a blue LED having a main wavelength of about 450 nm to about 455 nm in consideration of the efficiency of the excitation light source and the high color rendering of a white light emitted from the light emitting device. The full width at half maximum (FWHM) of a blue light emitted from the blue LED may also be about 19 nm to about 21 nm.

In the embodiment, a blue LED has been used which has a peak wavelength of about 445 nm, a main wavelength of about 451 nm, and a HWFM of about 19 nm.

A blue light emitted from the blue LED as described above may be combined with an excitation light emitted from phosphors to become a high color rendering white light, the phosphors including a first phosphor $BaSi_2O_2N_2$:Eu or $(Ba_x,Sr_{1-x})Si_2O_2N_2$:Eu where $0<x<1$, a second phosphor including $(Ba_x,Sr_{1-x})_2SiO_4$:Eu or $Lu_3(Al_x,Ga_{1-x})_5O_{12}$:Ce where $0<x<1$, a third phosphor including $Lu_3Al_5O_{12}$:Ce or $(Lu_x,Gd_{1-x})_3Al_5O_{12}$:Ce, $0<x<1$, and a fourth phosphor including $(Ca_x,Sr_{1-x})AlSiN_3$:Eu where $0<x<1$.

Figure 3:
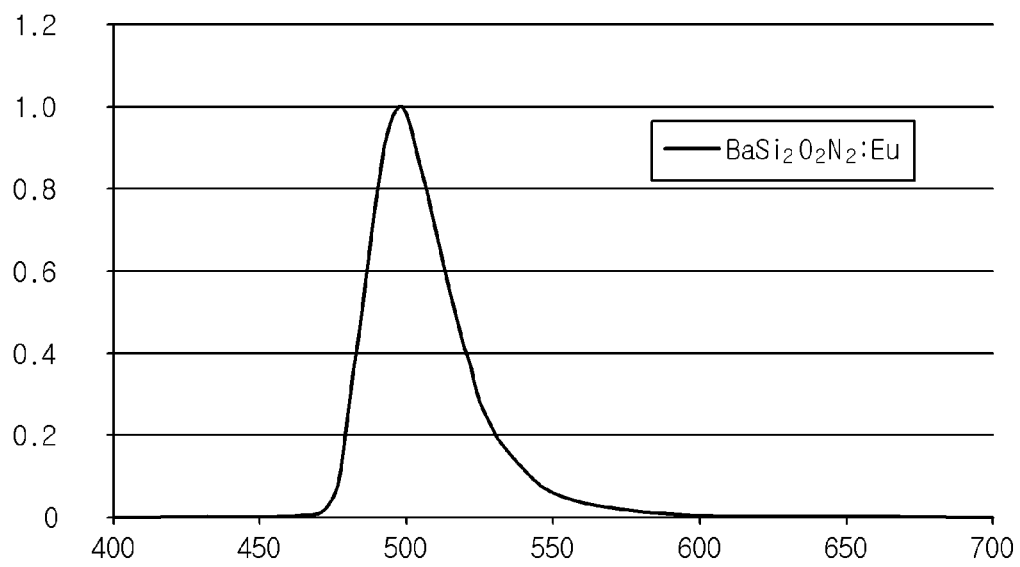
FIG. 3 shows a light emitting spectrum of a $BaSi_2O_2N_2$:Eu phosphor excited by light emitted from a blue LED as an embodiment of a first phosphor.

FIG. 3 shows a light emitting spectrum of a $BaSi_2O_2N_2$:Eu phosphor excited by light emitted from a blue LED as an embodiment of a first phosphor.

As shown in FIG. 3, the first phosphor may be $BaSi_2O_2N_2$:Eu or $(Ba_x,Sr_{1-x})Si_2O_2N_2$:Eu where $0<x<1$ and in the embodiment, a $BaSi_2O_2N_2$:Eu phosphor is illustrated. In the case of the light emitting spectrum of the $BaSi_2O_2N_2$:Eu phosphor excited by light emitted from the blue LED having a light emitting characteristic illustrated in FIG. 2, its main waveform is about 501 nm, its peak wavelength is about 497 nm, and its FWHM is about 31 nm.

Figure 4:
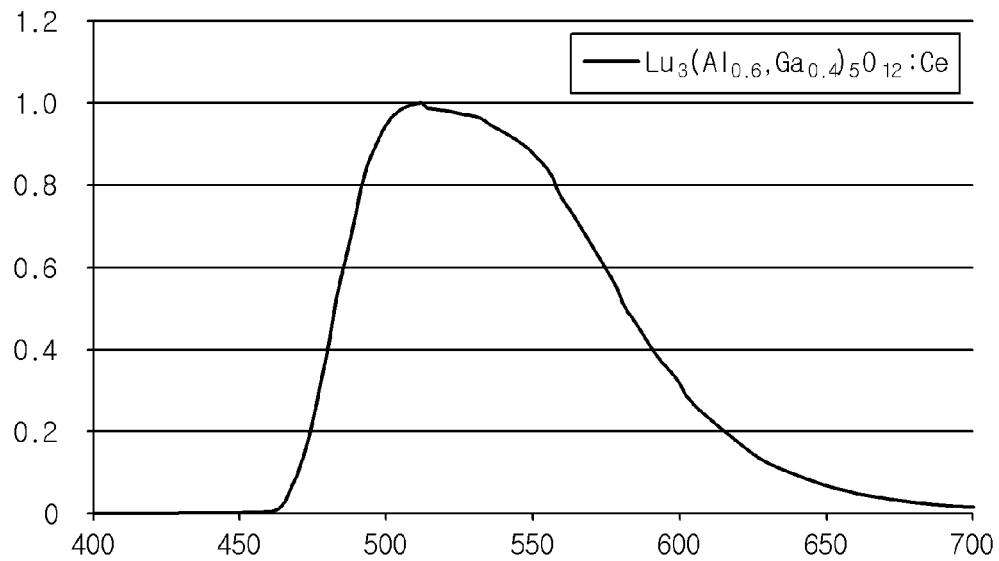
FIG. 4 shows a light emitting spectrum of a $Lu_3(Al_{0.6}, Ga_{0.4})_5O_{12}$:Ce phosphor excited by light emitted from a blue LED as an embodiment of a second phosphor.

FIG. 4 shows a light emitting spectrum of a $Lu_3(Al_{0.6},Ga_{0.4})_5O_{12}$:Ce phosphor excited by light emitted from a blue LED as an embodiment of a second phosphor.

As shown in FIG. 4, the second phosphor may be $(Ba_x,Sr_{1-x})_2SiO_4$:Eu or $Lu_3(Al_x,Ga_{1-x})_5O_{12}$:Ce where $0<x<1$ and in the embodiment, a $Lu_3(Al_{0.6},Ga_{0.4})_5O_{12}$:Ce phosphor is illustrated. In the case of the light emitting spectrum of the $Lu_3(Al_{0.6},Ga_{0.4})_5O_{12}$:Ce phosphor excited by light emitted from the blue LED having a light emitting characteristic illustrated in FIG. 2, its main waveform is about 515 nm, its peak wavelength is about 554 nm, and its FWHM is about 101 nm.

Figure 5:
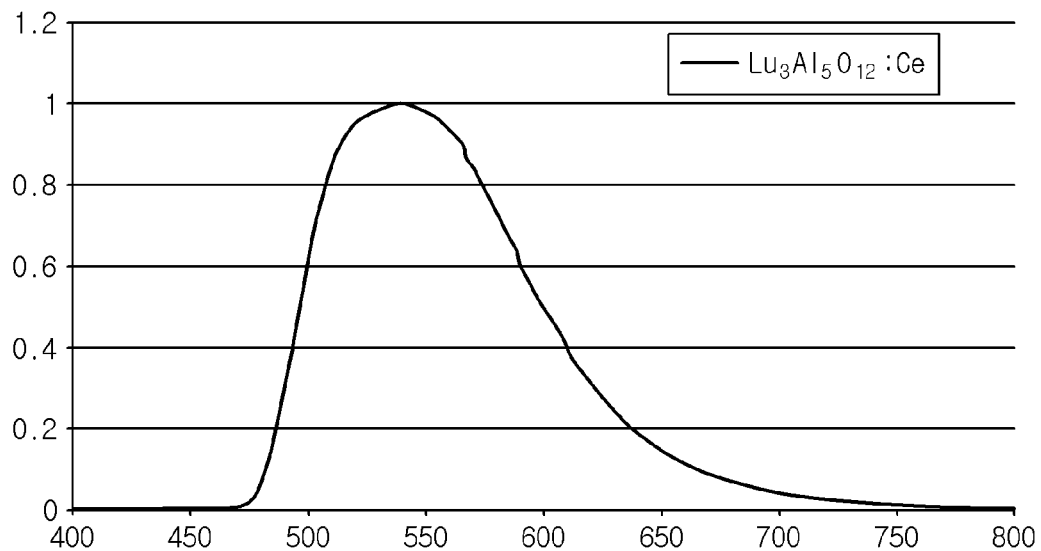
FIG. 5 shows a light emitting spectrum of a $Lu_3Al_5O_{12}$:Ce phosphor excited by light emitted from a blue LED as an embodiment of a third phosphor.

FIG. 5 shows a light emitting spectrum of a $Lu_3Al_5O_{12}$:Ce phosphor excited by light emitted from a blue LED as an embodiment of a third phosphor.

As shown in FIG. 5, the third phosphor may be $Lu_3Al_5O_{12}$:Ce or $(Lu_x,Gd_{1-x})_3Al_5O_{12}$:Ce where $0<x<1$ and in the embodiment, a $Lu_3Al_5O_{12}$:Ce phosphor is illustrated. In the case of the light emitting spectrum of the $Lu_3Al_5O_{12}$:Ce excited by light emitted from the blue LED having a light emitting characteristic illustrated in FIG. 2, its main waveform is about 559 nm, its peak wavelength is about 535 nm, and its FWHM is about 103 nm.

Figure 6:
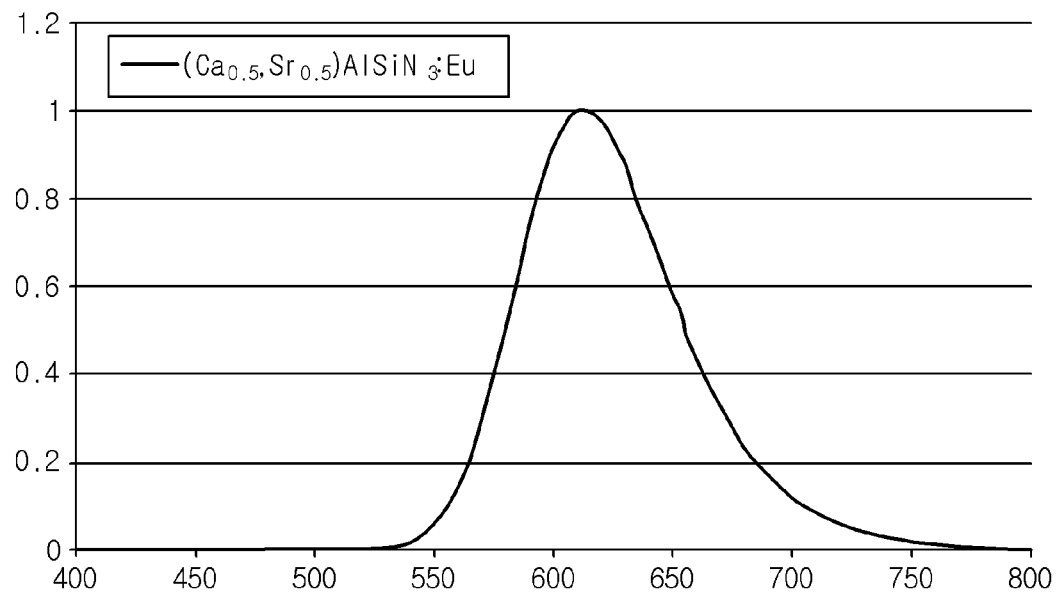
FIG. 6 shows a light emitting spectrum of a $(Ca_{0.5},Sr_{0.5})AlSiN_3$:Eu phosphor excited by light emitted from a blue LED as an embodiment of a fourth phosphor.

FIG. 6 shows a light emitting spectrum of a $(Ca_{0.5},Sr_{0.5})AlSiN_3$:Eu phosphor excited by light emitted from a blue LED as an embodiment of a fourth phosphor.

As shown in FIG. 6, the fourth phosphor may be $(Ca_x,Sr_{1-x})AlSiN_3$:Eu where $0<x<1$ and in the embodiment, a $(Ca_{0.5},Sr_{0.5})AlSiN_3$:Eu phosphor is illustrated. In the case of the light emitting spectrum of the $(Ca_{0.5},Sr_{0.5})AlSiN_3$:Eu excited by light emitted from the blue LED having a light emitting characteristic illustrated in FIG. 2, its main waveform is about 598 nm, its peak wavelength is about 610 nm, and its FWHM is about 76 nm.

Figure 7:
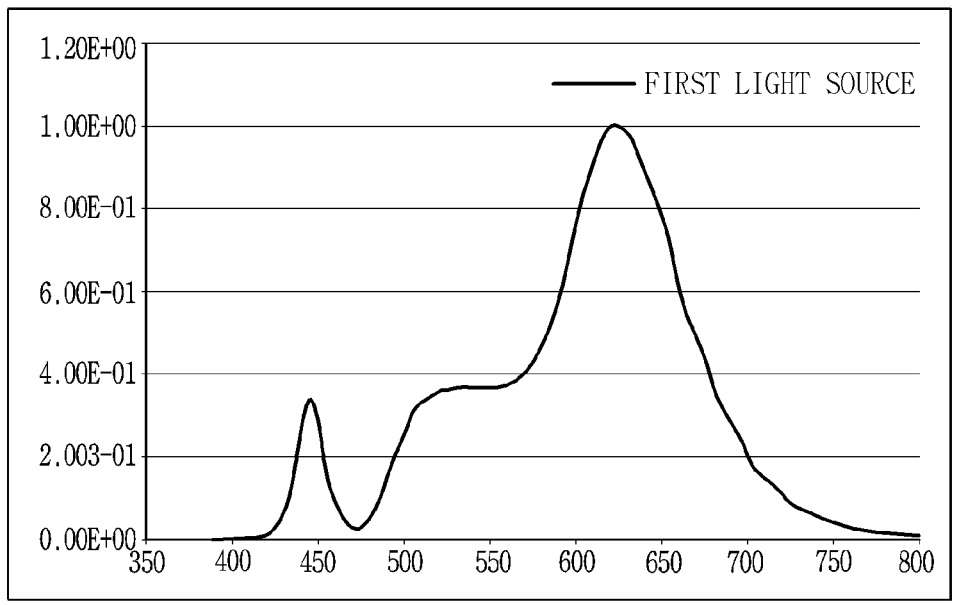
FIG. 7 shows the light emitting characteristic of a first white light source in a light emitting device according to an embodiment.

FIG. 7 shows the light emitting characteristic of a first white light source in a light emitting device according to an embodiment.

Referring to FIG. 7, the first white light source 510 in the light emitting device according to an embodiment includes a blue LED having a main wavelength of about 445 nm to 460 nm, and phosphors including the third phosphor emitting light having a main wavelength of about 555 nm to about 575 nm and the fourth phosphor emitting light having a main wavelength of about 580 nm to about 610 nm. The fourth phosphor may emit light having a main wavelength of about 580 nm to about 605 nm, e.g., about 580 nm to about 599 nm.

The third and fourth phosphors may be arranged around the blue LED, in which case they may be arranged in respective layers or mixed together.

The third phosphor may occupy about 85 weight % (wt %) to about 97 wt % of all the phosphors and the fourth phosphor may occupy about 3 wt % to about 15 wt % of all the phosphors.

In the embodiment, the third phosphor occupies about wt % of all the phosphors and the fourth phosphor occupies about 10 wt % of all the phosphors, in which case the internal quantum efficiency of the phosphors is equal to or higher than about 80% and the efficiency of light emitted from the blue LED is about 103 lm/W.

Figure 8:
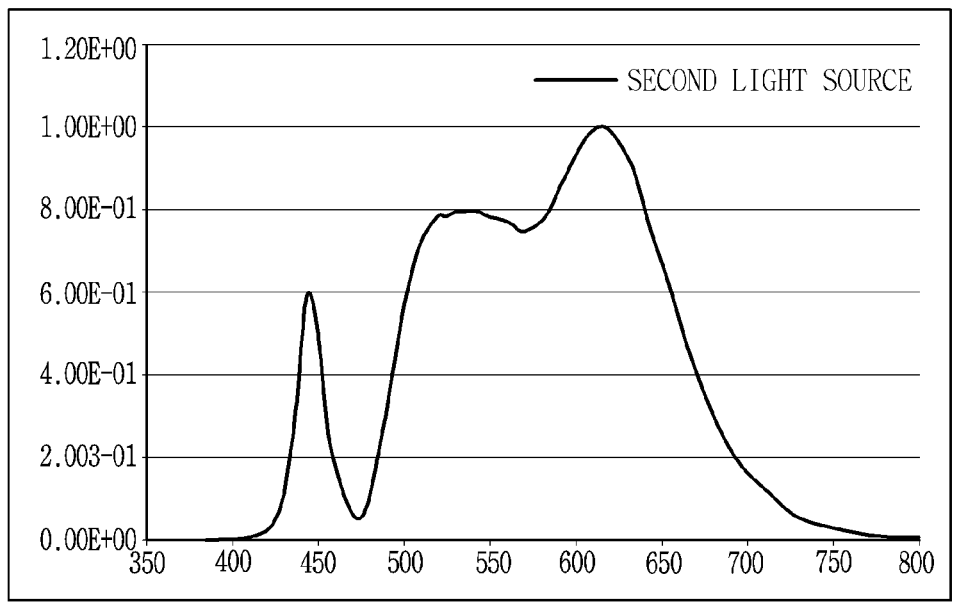
FIG. 8 shows the light emitting characteristic of a second white light source in a light emitting device according to an embodiment.

FIG. 8 shows the light emitting characteristic of a second white light source in a light emitting device according to an embodiment.

Referring to FIG. 8, the second white light source 520 in the light emitting device according to an embodiment includes a blue LED having a main wavelength of about 445 nm to 460 nm, and phosphors including the third phosphor emitting light having a main wavelength of about 555 nm to about 575 nm and the fourth phosphor emitting light having a main wavelength of about 580 nm to about 610 nm. The fourth phosphor may emit light having a main wavelength of about 580 nm to about 605 nm, e.g., about 580 nm to about 599 nm.

The third and fourth phosphors may be arranged around the blue LED, in which case they may be arranged in respective layers or mixed together.

The third phosphor may occupy about 85 wt % to about 97 wt % of all the phosphors and the fourth phosphor may occupy about 3 wt % to about 15 wt % of all the phosphors.

In the embodiment, the third phosphor occupies about wt % of all the phosphors and the fourth phosphor occupies about 6 wt % of all the phosphors, in which case the internal quantum efficiency of the phosphors is equal to or higher than about 80% and the efficiency of light emitted from the blue LED is about 146 lm/W.

Figure 9:
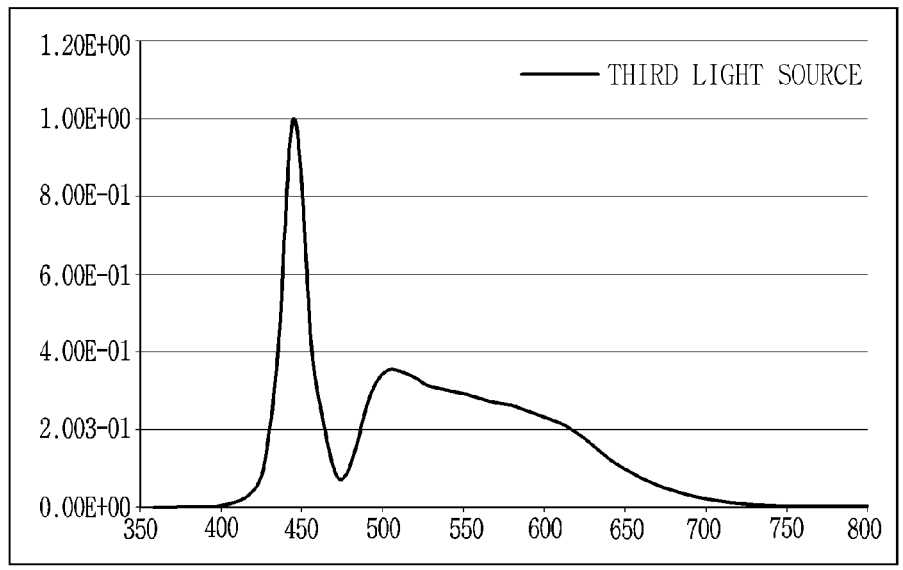
FIG. 9 shows the light emitting characteristic of a third white light source in a light emitting device according to an embodiment.

FIG. 9 shows the light emitting characteristic of a third white light source in a light emitting device according to an embodiment.

Referring to FIG. 9, the third white light source 530 in the light emitting device according to an embodiment includes a blue LED having a main wavelength of about 445 nm to about 460 nm, and phosphors including the first phosphor emitting light having a main wavelength of about 495 nm to about 510 nm or the second phosphor emitting light having a main wavelength of about 550 nm to about 555 nm, the third phosphor emitting light having a main wavelength of about 555 nm to about 575 nm and the fourth phosphor emitting light having a main wavelength of about 580 nm to about 610 nm. The fourth phosphor may emit light having a main wavelength of about 580 nm to about 605 nm, e.g., about 580 nm to about 599 nm.

The first or second phosphor, the third phosphor, and the fourth phosphors may be arranged around the blue LED, in which case they may be arranged in respective layers or mixed together.

The first or second phosphor may occupy about 15 wt % to about 30 wt % of all the phosphors, the third phosphor may occupy about 60 wt % to about 85 wt % of all the phosphors and the fourth phosphor may occupy about 10 or less wt % of all the phosphors.

In the embodiment, the first phosphor occupies about 25 wt % of all the phosphors, the third phosphor occupies about 72 wt % of all the phosphors, and the fourth phosphor occupies about 3 wt % of all the phosphors, in which case the internal quantum efficiency of the phosphors is equal to or higher than about 80% and the efficiency of light emitted from the blue LED is about 116 lm/W.

Figure 10:
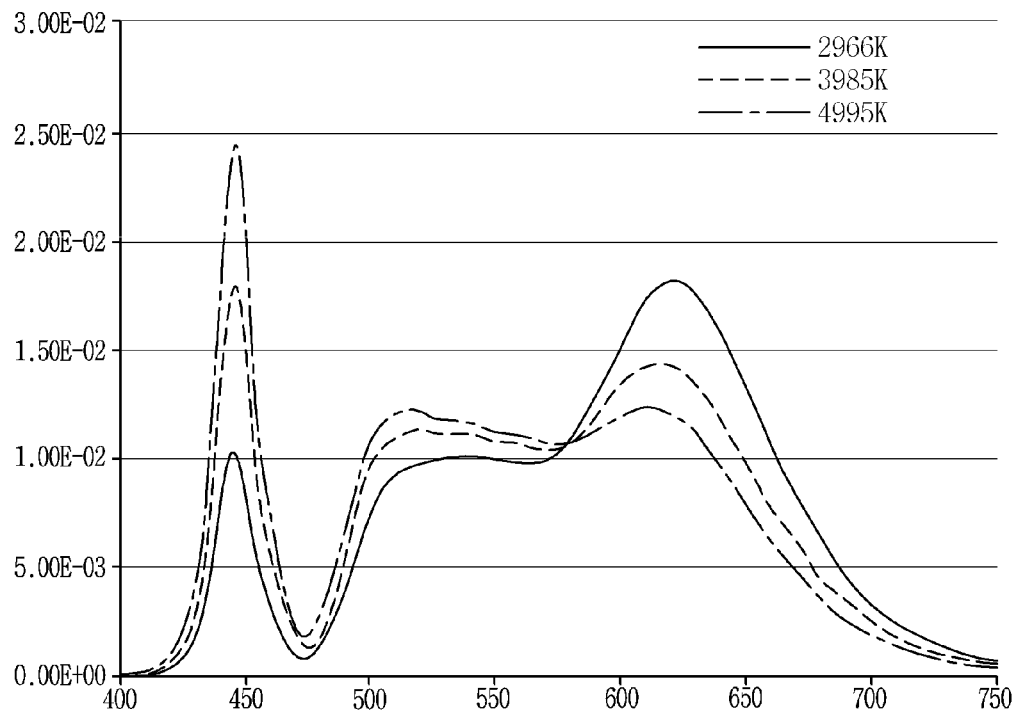
FIG. 10 shows the light emitting characteristic of a light emitting device according to an embodiment.

FIG. 10 shows the light emitting characteristic of a light emitting device according to an embodiment.

Referring to FIG. 10, the light emitting device includes the first to third white light sources 510 to 530, and FIG. 10 illustrates the light emitting characteristic when the light emitting device emits white lights having color temperatures of 2966K, 3985K and 4995K, respectively.

In the light emitting device according to the embodiment, the first to third white light sources 510 to 530 may be arranged on a circuit substrate or many neighboring circuit substrates or included in a package.

The first white light source 510 may occupy about 5% to 55% of the whole power consumption of the light emitting device, the second white light source 520 may occupy about 20% to about 60% of the whole power consumption of the light emitting device, and the third white light source 530 may occupy about 5% to about 55% of the whole power consumption of the light emitting device.

For example, when the first to third white light sources 510 to 530 have the same power consumption and are respectively included in plurality, the light emitting device may include five first 1W white light sources 510, three second 1W white light sources 520 and four third 1W white light sources 530.

The light emitting device having such a configuration may emit white lights having various color temperatures by controlling the quantity of light emitted from the first to third white light sources 510 to 530.

Firstly, when the light emitting device emits a white light having a temperature of 2966K, the first white light source 510 is 500 lm in luminous flux and 4.9 W in power consumption, the second white light source 520 is 400 lm in luminous flux and 2.7 W in power consumption, and the third white light source 530 is 100 lm in luminous flux and 0.9 W in power consumption. In addition, the light emitting device is 118 lm/W in efficiency, 93 in Ra and 76 in R9.

Also, when the light emitting device emits a white light having a temperature of 3,985K, the first white light source 510 is 220 lm in luminous flux and 2.1 W in power consumption, the second white light source 520 is 480 lm in luminous flux and 3.3 W in power consumption, and the third white light source 530 is 300 lm in luminous flux and 2.6 W in power consumption. In addition, the light emitting device is 124 lm/W in efficiency, 91 in Ra and 72 in R9.

Also, when the light emitting device emits a white light having a temperature of 4,995K, the first white light source 510 is 150 lm in luminous flux and 1.5 W in power consumption, the second white light source 520 is 350 lm in luminous flux and 2.4 W in power consumption, and the third white light source 530 is 500 lm in luminous flux and 4.3 W in power consumption. In addition, the light emitting device is 122 lm/W in efficiency, 90 in Ra and 62 in R9.

Figure 11:
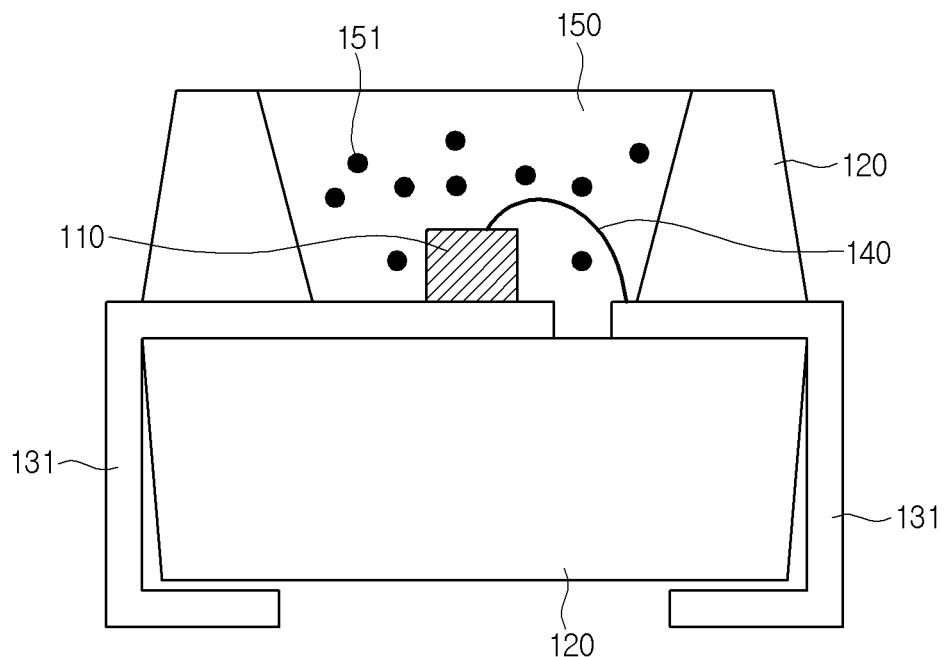
FIG. 11 shows a white light source in a light emitting device according to embodiments.

It is possible to emit white lights having various color temperatures by using the light emitting device having such a configuration. FIG. 11 shows a white light source in a light emitting device according to embodiments, and the white light source includes a blue light emitting diode LED (110) and phosphors according to embodiments that are mixed in an encapsulation member 150 surrounding the blue LED 110. Also, other phosphors not mentioned in the embodiments may be further included as needed.

The blue LED 110 may be a GaN based LED that emits a blue light having a main wavelength of about 445 nm to about 460 nm, e.g., about 455 nm and a FWHM of about 19 nm to about 21 nm.

The blue LED 110 may be adhered and fixed to electrodes 131 or a body 120 by using a silver paste. The blue LED 110 may be electrically connected to any one of the electrodes 131 through the silver paste and to the other of the electrodes through a wire 140.

The encapsulation member 150 may be manufactured by scattering phosphors 151 of an embodiment over an epoxy resin or a silicon resin. It is also possible to manufacture the encapsulation member by applying a manufactured encapsulation member 150 to the blue LED 110 or stacking it thereon and then curing and fixing the encapsulation member for about an hour at a temperature of about 100° C. to about 160° C.

Figure 12:
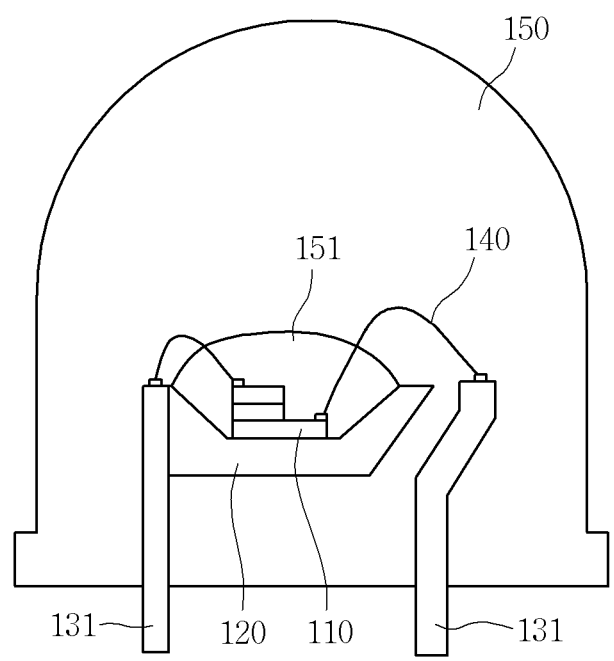
FIG. 12 is another example of a white light source in a light emitting device of an embodiment.

FIG. 12 is another example of a white light source in a light emitting device of an embodiment.

In describing the light emitting device as shown in FIG. 12, descriptions provided with respect to the white light source as shown in FIG. 11 are nor provided.

Referring to FIG. 12, the white light source may include the blue LED 110, the body 120 supporting the blue LED 110 and reflecting light emitted from the blue LED 110 upwardly, two electrically insulated electrodes 131 providing power to the blue LED 110, the wire 140 electrically connecting the blue LED 110 to the two electrodes 131, the phosphors 151 scattered over a light transmission resin formed of an epoxy resin or a silicon resin molding the blue LED 110, and the encapsulation member 150 encapsulating the blue LED 110, the body 120, the phosphors 151, and the wire 140. The phosphors 151 may be ones described in the embodiments.

Figure 13:
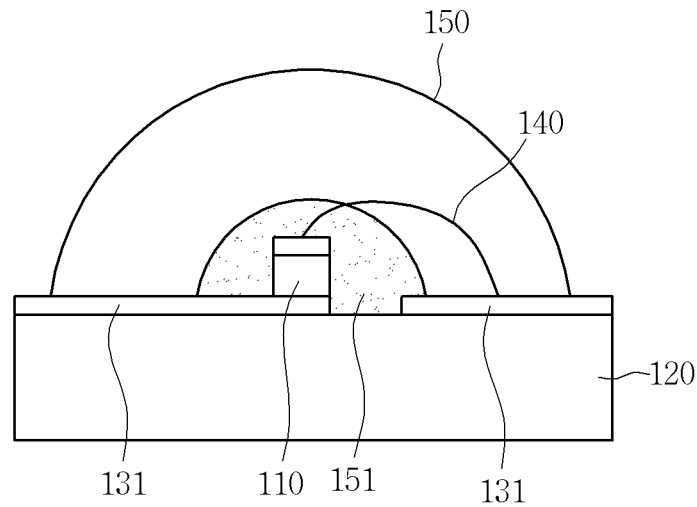
FIG. 13 is another example of a white light source in a light emitting device of an embodiment.

FIG. 13 is another example of a white light source in a light emitting device of an embodiment.

In describing the light emitting device as shown in FIG. 13, descriptions provided with respect to the white light source as shown in FIG. 11 are nor provided.

Referring to FIG. 13, the white light source may include the blue LED 110, the body 120 supporting the blue LED 110 and reflecting light emitted from the blue LED 110 upwardly, two electrodes 131 patterned on the body 120 and providing power to the blue LED 110, the wire 140 electrically connecting the blue LED 110 to any one of the two electrodes 131, the phosphors 151 scattered over a light transmission resin molding the blue LED 110, and the encapsulation member 150 arranged on the body 120 to encapsulate the blue LED 110. The phosphors 151 may be ones described in the embodiments.

Figure 14:
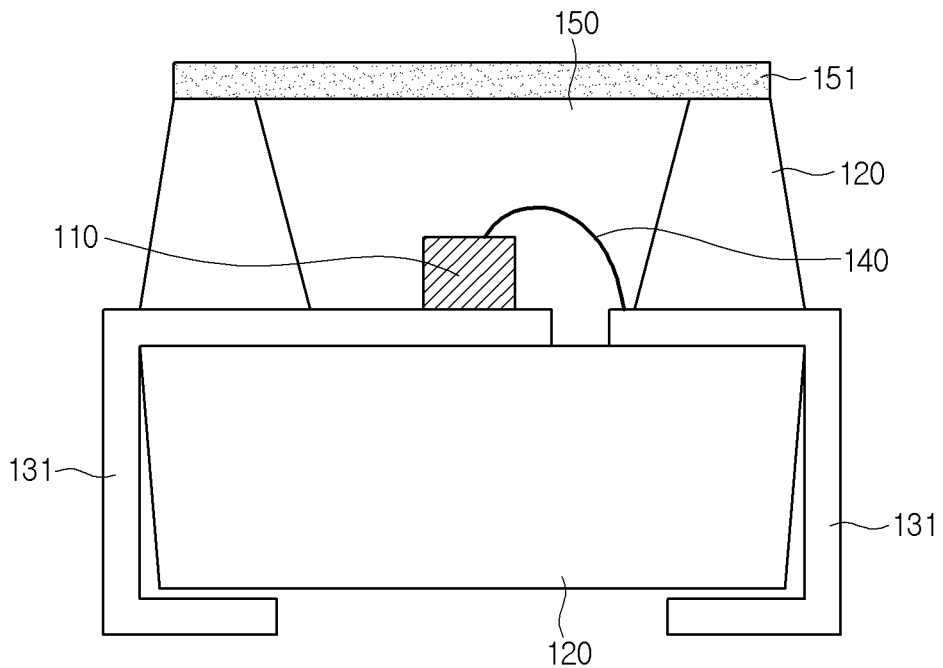
FIG. 14 is another example of a white light source in a light emitting device of an embodiment.

FIG. 14 is another example of a white light source in a light emitting device of an embodiment.

In describing the light emitting device as shown in FIG. 14, descriptions provided with respect to the white light source as shown in FIG. 11 are nor provided.

Referring to FIG. 14, the white light source may include the blue LED 110, the body 120 supporting the blue LED 110 and reflecting light emitted from the blue LED 110 upwardly, two electrodes 131 passing through the body 120 so that one side is arranged in a cavity formed in the body 120 and the other side is arranged at the bottom of the body 120 and providing power to the blue LED 110, the wire 140 electrically connecting the blue LED 110 to any one of the two electrodes 131, the encapsulation member 150 including a light transmission resin molding the blue LED 110, and the phosphors 151 arranged on the body 120 and/or the encapsulation member 150. The phosphors 151 may be ones described in the embodiments.

The phosphors 151 may also be scattered over the light transmission resin or be evenly formed on the body 120 and/or the encapsulation member 150. That is, the phosphors 151 may also be formed by conformal coating.

The blue LED 110 may be arranged in the cavity in the body 120 at an interval from the phosphor 151.

Figure 15:
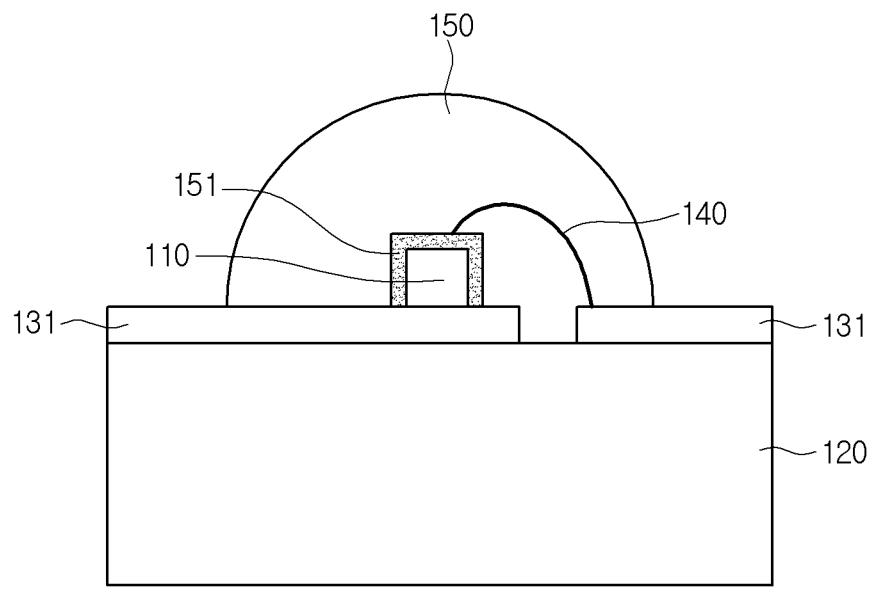
FIG. 15 is another example of a white light source in a light emitting device of an embodiment.

FIG. 15 is another example of a white light source in a light emitting device of an embodiment.

In describing the light emitting device as shown in FIG. 15, descriptions provided with respect to the white light source as shown in FIG. 11 are nor provided.

Referring to FIG. 15, the white light source may include the blue LED 110, the body 120 supporting the blue LED 110 and reflecting light emitted from the blue LED 110 upwardly, two electrodes 131 patterned on the body 120 and providing power to the blue LED 110, the wire 140 electrically connecting the blue LED 110 to any one of the two electrodes 131, the phosphors 151 formed on the blue LED 110, and the encapsulation member 150 arranged on the body 120 to encapsulate the blue LED 110. The phosphors 151 may be ones described in the embodiments.

The phosphors 151 may be disposed evenly on the surface of the blue LED 110 and be in contact with the top and sides of the blue LED 110.

Figure 16:
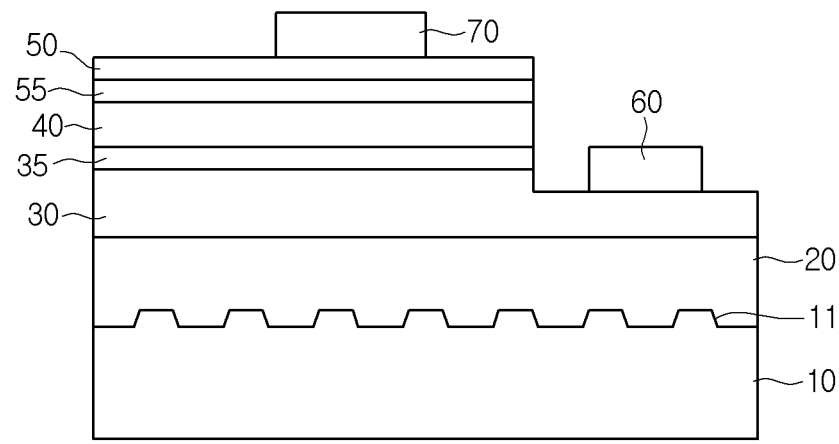
FIG. 16 is an example of a blue LED capable of being used in a white light source in a light emitting device of an embodiment.

FIG. 16 is an example of a blue LED capable of being used in a white light source in a light emitting device of an embodiment.

The blue LED 110 according to an embodiment includes a emissive layer that includes an un-doped semiconductor layer 20 on a substrate 10, a first conductive semiconductor layer 30 on the un-doped semiconductor layer 20, an active layer 40, and a second conductive semiconductor layer 50, in which case a first electrode 60 is disposed on the first conductive semiconductor layer 30 and a second electrode 90 is disposed on the second conductive semiconductor layer 50.

Also, a first conductive InGaN/GaN super-lattice structure or InGaN/InGaN super-lattice structure 35 may also be formed between the first conductive semiconductor layer 30 and the active layer 40.

Also, a second conductive AlGaN layer 55 may also be disposed between the second conductive semiconductor layer 50 and the active layer 40.

The substrate 10 may be formed of at least one of aluminum oxide ($Al_2O_3$), silicon carbide (SiC), gallium arsenide (GaAs), gallium nitride (GaN), zinc oxide (ZnO), silicon (Si), gallium phosphorous (GaP), indium phosphorous (InP), and germanium (Ge) and is not limited thereto. For example, the substrate 10 functions as a growth substrate on which the emissive layer grows and may be a sapphire substrate.

A plurality of protruding patterns 11 may be formed on the substrate 10 and scatter light emitted from the active layer 40 to thus increase light efficiency.

For example, the protruding pattern 11 may be formed in the shape of any one of a hemisphere, a polygon, a triangular pyramid, and a nano-pillar.

A first conductive dopant is not intentionally injected into the un-doped semiconductor layer 20, which is however a nitride capable of having a first conductive characteristic, and an un-doped nitride layer 20 may also be formed as an un-doped GaN layer. A buffer layer may also be disposed between the un-doped semiconductor layer 20 and the substrate 10. Also, the un-doped semiconductor layer 20 is not necessarily disposed, which may, that is, not be disposed.

The first conductive semiconductor layer 30 may include an n-type semiconductor layer, for example. The first conductive semiconductor layer 30 may be selected from semiconductor materials having the formula $In_xAl_yGa_{1-x-y}N$ (where $0 \leq x \leq 1$, $0 \leq y \leq 1$, and $0 \leq x+y \leq 1$), such as InAlGaN, GaN, AlGaN, AlInN, InGaN, AlN, and InN, and an n-type dopant using Si, Ge or Sn may be doped.

The active layer 40 is a layer on which an electron (or a hole) injected through the first conductive semiconductor layer 30 meets with a hole (or an electron) injected through the second conductive semiconductor layer 50 to emit light by the band gap difference of an energy band depending on a material forming the active layer 40.

The active layer 40 may be formed in any one of a single quantum well structure, a multi-quantum well structure (MQW), a quantum dot structure or a quantum wire structure but is not limited thereto.

The active layer 40 may be formed of a semiconductor material having the formula $In_xAl_yGa_{1-x-y}N$ (where $0 \leq x \leq 1$, $0 \leq y \leq 1$, and $0 \leq x+y \leq 1$). When the active layer 40 is formed in the MQW structure, the active layer 40 may be formed by the stacking of a plurality of well layers and a plurality of barrier layers, such as an InGaN well layer/GaN barrier layer.

A clad layer (not shown) with doped with an n-type or p-type dopant may be disposed on and/or under the active layer 40 and the clad layer (not shown) may be implemented in an AlGaN layer or InAlGaN layer.

The second conductive semiconductor layer 50 may be implemented in a p-type semiconductor layer, for example. The second conductive semiconductor layer 50 may be selected from semiconductor materials having the formula $In_xAl_yGa_{1-x-y}N$ (where $0 \leq x \leq 1$, $0 \leq y \leq 1$, and $0 \leq x+y \leq 1$), such as InAlGaN, GaN, AlGaN, InGaN, AlInN, AlN, and InN, and a p-type dopant using Mg, Zn, Ca, Sr, or Ba may be doped.

On the contrary, the first conductive semiconductor layer 30 may include the p-type semiconductor layer and the second conductive semiconductor layer 50 may also include the n-type semiconductor layer. Also, a third conductive semiconductor layer (not shown) that includes an n-type or p-type semiconductor layer may also be disposed on the second conductive semiconductor layer 50 and accordingly, the emissive layer may have at least one of np, pn, npn, and pnp junction structures. Also, the doping concentration of a dopant in the first conductive semiconductor layer 30 and the second conductive semiconductor layer 50 may be uniform or non-uniform. That is, the structure of the emissive layer may vary and has no limitation.

The first electrode 60 is arranged on the first conductive semiconductor layer 30 and the second electrode 70 is arranged on the second conductive semiconductor layer 50 so that they provide power to the active layer.

The blue LED may be a GaN based LED having a main wavelength of about 445 nm to about 460 nm, e. g., about 455 nm.

Figure 17:
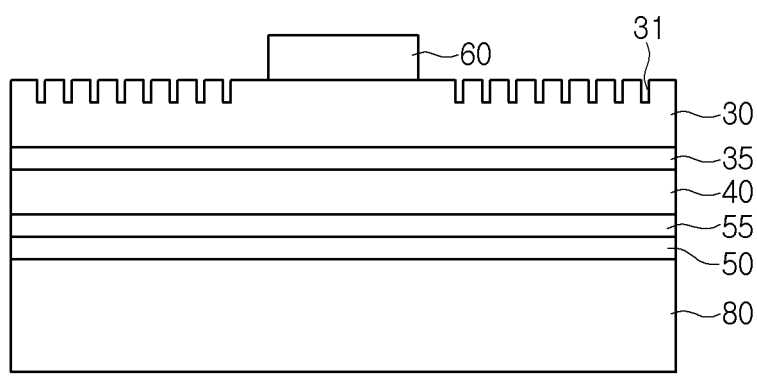
FIG. 17 is an example of a blue LED capable of being used in a white light source in a light emitting device of an embodiment.

FIG. 17 is another example of a blue LED capable of being used in a white light source in a light emitting device of an embodiment. In describing the blue LED shown in FIG. 17, descriptions of the blue LED as shown in FIG. 16 are not provided.

Referring to FIG. 17, the blue LED may include an emissive layer including a conductive support substrate 80, the first conductive semiconductor layer 30 on the conductive support substrate 80, the active layer 40, and the second conductive semiconductor layer 50, and the first electrode 60 on the first conductive semiconductor layer 30.

Also, a first conductive InGaN/GaN super-lattice structure or InGaN/InGaN super-lattice structure 35 may also be formed between the first conductive semiconductor layer 30 and the active layer 40.

Also, a second conductive AlGaN layer 55 may also be disposed between the second conductive semiconductor layer 50 and the active layer 40.

Also, a light extracting structure 31 having a pillar or hole shape may be formed in the first conductive semiconductor layer 30, and the light extracting structure 30 enables light emitted from the active layer 40 to be effectively extracted to the outside.

For example, the light extracting structure 31 may be formed in the shape of any one of a hemisphere, polygon, triangular pyramid, and nano-pillar and may also be formed of photonic crystal.

The conductive support substrate 80 may support the emissive layer and provide power to the emissive layer along with the first electrode 60.

The conductive support substrate 175 may include a support layer, reflective layer and ohmic contact layer, and the support layer may include at least one of copper (Cu), gold (Au), nickel (Ni), molybdenum (Mo), copper/tungsten (Cu/W) alloy, or a carrier wafer (e.g., silicon (Si), germanium (Ge), gallium arsenide (GaAs), zinc oxide (ZnO), or silicon carbide (SiC)). Also, the reflective layer may be formed of a metal including silver (Ag) or aluminum (Al), and the ohmic contact layer may be formed of a material being in ohmic contact with the second conductive semiconductor layer 50 and implemented in a single layer or multiple layers by using one or more of an indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), an $IrO_x$, an $RuO_x$, an $RuO_x/ITO$, Ni, Ag, $Ni/IrO_x/Au$, or $Ni/IrO_x/Au/ITO$, for example.

The emissive layer may include a plurality of III group to V group compound semiconductor layers.

The first conductive semiconductor layer 30 may include an n-type semiconductor layer, for example. The first conductive semiconductor layer 30 may be selected from semiconductor materials having the formula $In_xAl_yGa_{1-x-y}N$ (where $0 \leq x \leq 1$, $0 \leq y \leq 1$, and $0 \leq x+y \leq 1$), such as InAlGaN, GaN, AlGaN, AlInN, InGaN, AlN, and InN, and an n-type dopant using Si, Ge or Sn may be doped.

The active layer 40 is a layer on which an electron (or a hole) injected through the first conductive semiconductor layer 30 meets with a hole (or an electron) injected through the second conductive semiconductor layer 50 to emit light by the band gap difference of an energy band depending on a material forming the active layer 40.

The active layer 40 may be formed in any one of a single quantum well structure, a multi-quantum well structure (MQW), a quantum dot structure or a quantum wire structure but is not limited thereto.

The active layer 40 may be formed of a semiconductor material having the formula $In_xAl_yGa_{1-x-y}N$ (where $0 \leq x \leq 1$, $0 \leq y \leq 1$, and $0 \leq x+y \leq 1$). When the active layer 40 is formed in the MQW structure, the active layer 40 may be formed by the stacking of a plurality of well layers and a plurality of barrier layers, such as an InGaN well layer/GaN barrier layer.

A clad layer (not shown) with doped with an n-type or p-type dopant may be disposed on and/or under the active layer 40 and the clad layer (not shown) may be implemented in an AlGaN layer or InAlGaN layer.

The second conductive semiconductor layer 50 may be implemented in a p-type semiconductor layer, for example. The second conductive semiconductor layer 50 may be selected from semiconductor materials having the formula $In_xAl_yGa_{1-x-y}N$ (where 0≤x≤1, 0≤y≤1, and 0≤x+y≤1), such as InAlGaN, GaN, AlGaN, InGaN, AlInN, AlN, and InN and a p-type dopant using Mg, Zn, Ca, Sr, or Ba may be doped.

On the contrary, the first conductive semiconductor layer 30 may include the p-type semiconductor layer and the second conductive semiconductor layer 50 may also include the n-type semiconductor layer. Also, a third conductive semiconductor layer (not shown) that includes an n-type or p-type semiconductor layer may also be disposed on the second conductive semiconductor layer 50 and accordingly, the emissive layer may have at least one of np, pn, npn, and pnp junction structures. Also, the doping concentration of a dopant in the first conductive semiconductor layer 30 and the second conductive semiconductor layer 50 may be uniform or non-uniform. That is, the structure of the emissive layer may vary and has no limitation.

Also, a current breaking region (not shown) may be formed between the second conductive semiconductor layer 50 and the conductive support substrate 80 to at least partially overlap with the first electrode 60, and the current breaking region may be formed of a material having lower conductivity than the conductive support substrate 80 or an electric insulating material or may be formed by applying a plasma damage to the second conductive semiconductor layer 50. The current breaking region enables a current to flows over a wide range so that the light efficiency of the active layer 40 may increase.

The blue LED may be a GaN based LED having a main wavelength of about 445 nm to about 460 nm, e. g., about 455 nm.

The embodiments may provide a new light emitting device.

The embodiments may also provide a light emitting device that may emit light having various color temperatures by using a few white light sources.

Although only particular examples of embodiments are described in detail, it is obvious to a person skilled in the art that many variations and modifications may be implemented within the technical spirit of embodiments and these variations and modifications also fall within the following claims.

What is claimed is:

1. A light emitting device comprising:
a first white light source emitting a white light of which color coordinates exist within a MacAdam 10-step ellipse from color coordinates (0.4822, 0.3980);
a second white light source emitting a white light of which color coordinates exist within a MacAdam 10-step ellipse from color coordinates (0.4180, 0.4337); and
a third white light source emitting a white light of which color coordinates exist within a MacAdam 10-step ellipse from color coordinates (0.2806, 0.2981).

2. The light emitting device according to claim 1, wherein the first white light source comprises a blue light emitting diode (LED) and phosphors, wherein the phosphors comprise a third phosphor emitting light having a main wavelength of about 555 nm to about 575 nm, and a fourth phosphor emitting light having a main wavelength of about 580 nm to about 610 nm.

3. The light emitting device according to claim 1, wherein the second white light source comprises a blue light emitting diode (LED) and phosphors, wherein the phosphors comprise a third phosphor emitting light having a main wavelength of about 555 nm to about 575 nm, and a fourth phosphor emitting light having a main wavelength of about 580 nm to about 610 nm.

4. The light emitting device according to claim 1, wherein the third white light source comprises a blue light emitting diode (LED) and phosphors, wherein the phosphors comprise a first phosphor or a second phosphor, the first phosphor emitting light having a main wavelength of about 495 nm to about 510 nm and the second phosphor emitting light having a main wavelength of about 550 nm to about 555 nm, a third phosphor emitting light having a main wavelength of about 555 nm to about 575 nm, and a fourth phosphor emitting light having a main wavelength of about 580 nm to about 610 nm.

5. A light emitting device comprising:
a first white light source comprising a blue LED and phosphors, wherein the phosphors comprise a third phosphor emitting light having a main wavelength of about 555 nm to about 575 nm, and a fourth phosphor emitting light having a main wavelength of about 580 nm to about 610 nm;
a second white light source comprising the blue LED and phosphors, wherein the phosphors comprise a third phosphor emitting light having a main wavelength of about 555 nm to about 575 nm, and a fourth phosphor emitting light having a main wavelength of about 580 nm to about 610 nm; and
a third white light source comprising the blue light emitting diode (LED) and phosphors, wherein the phosphors comprise a first phosphor or a second phosphor, the first phosphor emitting light having a main wavelength of about 495 nm to about 510 nm and the second phosphor emitting light having a main wavelength of about 550 nm to about 555 nm, a third phosphor emitting light having a main wavelength of about 555 nm to about 575 nm, and a fourth phosphor emitting light having a main wavelength of about 580 nm to about 610 nm.

6. The light emitting device according to claim 5, wherein the first phosphor comprises $BaSi_2O_2N_2:Eu$ or $(Ba_x,Sr_{1-x})Si_2O_2N_2:Eu$ where 0<x<1.

7. The light emitting device according to claim 5, wherein the second phosphor comprises $(Ba_x,Sr_{1-x})_2SiO_4:Eu$ or $Lu_3(Al_x,Ga_{1-x})_5O_{12}:Ce$ where 0<x<1.

8. The light emitting device according to claim 5, wherein the third phosphor comprises $Lu_3Al_5O_{12}:Ce$ or $(Lu_x,Gd_{1-x})_3Al_5O_{12}:Ce$ where 0<x<1.

9. The light emitting device according to claim 5, wherein the fourth phosphor comprises $(Ca_x,Sr_{1-x})AlSiN_3:Eu$ where 0<x<1.

10. The light emitting device according to claim 5, wherein in the first white light source, the third phosphor occupies about 85 wt % to about 97 wt % of all the phosphors and the fourth phosphor occupies about 3 wt % to about 15 wt % of all the phosphors.

11. The light emitting device according to claim 10, wherein in the first white light source, the third phosphor occupies about 90 wt % of all the phosphors and the fourth phosphor occupies about 10 wt % of all the phosphors.

12. The light emitting device according to claim 5, wherein in the second white light source, the third phosphor occupies about 85 wt % to about 97 wt % of all the phosphors and the fourth phosphor occupies about 3 wt % to about 15 wt % of all the phosphors.

13. The light emitting device according to claim 12, wherein in the second white light source, the third phosphor occupies about 94 wt % of all the phosphors and the fourth phosphor occupies about 6 wt % of all the phosphors.

14. The light emitting device according to claim 5, wherein in the third white light source, the first or second phosphor occupies about 15 wt % to about 30 wt % of all the phosphors, the third phosphor occupies about 60 wt % to about 85 wt % of all the phosphors and the fourth phosphor occupies about 10 or less wt % of all the phosphors.

15. The light emitting device according to claim 14, wherein in the third white light source, the first phosphor occupies about 25 wt % of all the phosphors, the third phosphor occupies about 72 wt % of all the phosphors and the fourth phosphor occupies about 3 wt % of all the phosphors.

16. The light emitting device according to claim 5, wherein the first white light source occupies about 5% to about 55% of whole power consumption of the light emitting device, the second white light source occupies about 20% to about 60% of whole power consumption of the light emitting device, and the third white light source occupies about 5% to about 55% of whole power consumption of the light emitting device.

17. The light emitting device according to claim 5, wherein in the first white light source, the third phosphor occupies about 85 wt % to about 97 wt % of all the phosphors and the fourth phosphor occupies about 3 wt % to about 15 wt % of all the phosphors, and
wherein in the second white light source, the third phosphor occupies about 85 wt % to about 97 wt % of all the phosphors and the fourth phosphor occupies about 3 wt % to about 15 wt % of all the phosphors.

18. The light emitting device according to claim 17, wherein in the third white light source, the first or second phosphor occupies about 15 wt % to about 30 wt % of all the phosphors, the third phosphor occupies about 60 wt % to about 85 wt % of all the phosphors and the fourth phosphor occupies about 10 or less wt % of all the phosphors.

19. The light emitting device according to claim 5, wherein the first phosphor comprises $BaSi_2O_2N_2:Eu$ or $(Ba_x,Sr_{1-x})Si_2O_2N_2:Eu$ where $0<x<1$,
wherein the second phosphor comprises $(Ba_x,Sr_{1-x})_2SiO_4:Eu$ or $Lu_3(Al_x,Ga_{1-x})_5O_{12}:Ce$ where $0<x<1$,
wherein the third phosphor comprises $Lu_3Al_5O_{12}:Ce$ or $(Lu_x,Gd_{1-x})_3Al_5O_{12}:Ce$ where $0<x<1$, and
wherein the fourth phosphor comprises $(Ca_x,Sr_{1-x})AlSiN_3:Eu$ where $0<x<1$.

20. The light emitting device according to claim 19, wherein in the first white light source, the third phosphor occupies about 85 wt % to about 97 wt % of all the phosphors and the fourth phosphor occupies about 3 wt % to about 15 wt % of all the phosphors,
wherein in the second white light source, the third phosphor occupies about 85 wt % to about 97 wt % of all the phosphors and the fourth phosphor occupies about 3 wt % to about 15 wt % of all the phosphors, and
wherein in the third white light source, the first or second phosphor occupies about 15 wt % to about 30 wt % of all the phosphors, the third phosphor occupies about 60 wt % to about 85 wt % of all the phosphors and the fourth phosphor occupies about 10 or less wt % of all the phosphors.

* * * * *